United States Patent [19]

Rees et al.

[11] Patent Number: 5,781,034
[45] Date of Patent: Jul. 14, 1998

[54] REDUCED OUTPUT SWING WITH P-CHANNEL PULLUP DIODE CONNECTED

[75] Inventors: David Rees, Overton; Sandeep Pant, Basingstoke, both of United Kingdom

[73] Assignee: Cypress Semiconductor Corporation, San Jose, Calif.

[21] Appl. No.: 680,288

[22] Filed: Jul. 11, 1996

[51] Int. Cl.[6] .................. H03K 19/0185; H03K 19/0948
[52] U.S. Cl. ............................ 326/86; 326/81; 326/83; 327/319; 327/328
[58] Field of Search .......................... 326/80–81, 68, 326/83, 86, 121, 17, 57–58; 327/313, 328, 318–319, 312, 333

[56] References Cited

U.S. PATENT DOCUMENTS

| | | | |
|---|---|---|---|
| 5,038,056 | 8/1991 | Koide et al. | 326/27 |
| 5,073,726 | 12/1991 | Kato et al. | 326/58 |
| 5,179,299 | 1/1993 | Tipon | 326/17 |
| 5,373,199 | 12/1994 | Shichinohe et al. | 327/328 |
| 5,444,397 | 8/1995 | Wong et al. | |

OTHER PUBLICATIONS

Weste et al. *CMOS VLSI Design: A Systems Perspective.* Addison-Wesley. 1988, pp. 55–57.

*Primary Examiner*—Jon Santamauro
*Attorney, Agent, or Firm*—Dykema Gossett PLLC

[57] ABSTRACT

An output buffer having a reduced-swing output includes a p-channel pullup transistor as the primary pullup device. A biasing circuit is provided so as to bias the gate terminal of the pullup p-channel transistor to a predetermined level. The predetermined level is effective to cause the p-channel pullup transistor to shut off when the output of the buffer reaches a reduced magnitude output level ($V_{OH}$). In the disclosed embodiment, the biasing circuit includes an n-channel transistor connected between the gate and drain terminals of the p-channel pullup transistor. The biasing circuit also includes a p-channel transistor having a source terminal connected to $V_{cc}$, and a drain terminal connected to the gate of the pullup transistor. When the output of the buffer is desired to be in a logic high state, both of the biasing transistors are "ON." The voltage applied to the gate of the pullup transistor is, in effect, the result of the voltage divider effect between the "ON" resistances of the two biasing transistors. These transistors divide the voltage between $V_{cc}$ and the voltage on the drain of the pullup transistor. A third p-channel transistor is provided, and which has a source terminal connected to $V_{cc}$, and a drain terminal connected to the gate of the p-channel pullup transistor. This transistor is provided to turn the pullup transistor completely "OFF" in predetermined situations, such as when a pulldown circuit is to be activated, or when the buffer is to be tri-stated.

23 Claims, 2 Drawing Sheets

REDUCED OUTPUT SWING WITH P-CHANNEL PULLUP DIODE CONNECTED

BACKGROUND OF THE INVENTION

1. Field of the Invention

The present invention relates generally to output buffers connected to a pad of a semiconductor device, and, in particular, to an output buffer having a p-channel pullup device having a reduced output voltage swing.

2. Description of the Related Art

There has been much investigation concerning input and output cell designs for semiconductor devices. This investigation has been due, in part, to the emergence of a 3 volt operating voltage standard, which has joined the ubiquitous 5 volt standard that has existed for many years. In particular, some conventional 5 volt designs have been configured to drive an output node thereof to a level that is less than the full rail voltage of 5 volts. This parameter, commonly indicated as $V_{OH}$, has been specified in some applications to be approximately 4 volts. Such designs have obtained this reduced $V_{OH}$ by conventionally using an n-channel transistor as the pullup device of the I/O cell. Using such a device automatically provides the above-mentioned reduced voltage swing, turning off when the output level on the pad (i.e., the source of the n-channel device) reaches approximately 4 volts. This occurs because the device no longer has a gate-to-source voltage ($V_{GS}$) that is equal to or more positive than the device threshold voltage $V_T$.

In contrast to this reduced-swing output, semiconductor devices employing the above-mentioned 3 volt power supplies (or a 3.3 volt supply, or others in this range) must provide an output buffer design that is capable of driving an output, when in a logic high state, to a level $V_{OH}$ that is substantially equal to the positive power supply bus (e.g., 3 volts, for a 3 volt based system). This full-rail swing may not easily be generated using an n-channel device. Accordingly, in many conventional output buffer designs in semiconductor devices using the 3 volt standard, a p-channel transistor is used as the pullup device.

A problem thus arises when a particular semiconductor device is contemplated for use with both the 5 volt standard (with a reduced $V_{OH}$ swing), and, the 3 volt standard (with a full-rail swing). In particular, the problem involves having to change the n-channel device into a p-channel device when porting the 5 volt design to the 3 volt design. For example only, an 8-bit latch may be offered, in one implementation, for operation at 5 volts, while, in a second implementation, for operation at 3 volts. The logic function for each implementation may be the same or similar, but for the 5 volt implementation, an n-channel pullup structure may commonly be used, while, for the 3 volt implementation, a p-channel implementation may commonly be used. The respective pullup devices are quite dissimilar, and providing a unified design is thus fairly difficult.

One solution may be to place both an n-channel pullup structure, and a p-channel pullup structure on the same chip, and use only one of the two structures depending on the selected power standard. However, these output structures are very large, and thus require a large area on the semiconductor die. Accordingly, the primary disadvantage of this approach relates to die utilization. In particular, if only one of the two structures are used, while the other remains inactive, then a significant amount of die area is wasted thus resulting in a less competitive product.

Another solution that has been suggested involves developing different process masks for each one of the 5 volt, and 3 volt implementations at least insofar as the pullup structure is concerned. This approach, however, has the disadvantage of being extremely complicated, and expensive, since generating new process masks to implement the different pullup structures is a non-trivial matter.

Yet another solution that has been suggested is to use n-channel devices for both 5 volt, and 3 volt device implementations. Although this approach overcomes the problem of converting an n-channel device into a p-channel device, such an approach has its own set of disadvantages. One such disadvantage involves the fact that the n-channel pullup device for a 3 volt implementation must have a biasing signal applied to the gate terminal thereof that is "pumped" to a higher voltage than the chip operating voltage of $V_{cc}=3$ volts. This requirement demands that a charge pump capable of supplying such an elevated voltage be designed and incorporated on the chip, which typically increases the overall chip power dissipation.

Accordingly, there is a need to provide an improved output buffer structure that reduces or eliminates one or more of the problems as set forth above.

SUMMARY OF THE INVENTION

An output buffer in accordance with the present invention is suitably adapted to be connected to a pad of a semiconductor device, and provides a reduced output swing relative to the device operating voltage $V_{cc}$. The buffer is of simple design, and, since it is based on the use of a p-channel transistor as the pullup device, requires only minor modifications to a biasing circuit thereof in order to provide the full-rail swing that is needed for low operating voltage parts (e.g., 3 volts).

To achieve these as well as other features and advantages, an output buffer is provided which includes a pullup p-channel transistor and means for biasing the p-channel pullup device. The pullup p-channel transistor includes a source terminal connected to a positive power supply bus $V_{cc}$ (which produces a predetermined voltage level), and a drain terminal connected to the pad. The biasing means performs the function of biasing a gate terminal of the pullup p-channel transistor, which incorporates a voltage signal derived from the pad as a feedback signal, so as to produce a logic high output signal that has a magnitude that is reduced relative to $V_{cc}$.

In a preferred embodiment, the biasing means comprises a biasing p-channel transistor, and a biasing n-channel transistor. The p-channel biasing transistor includes source and drain terminals connected to $V_{cc}$, and the pullup transistor gate terminal, respectively. The biasing n-channel transistor includes drain and source terminals connected to the pullup transistor gate terminal, and the pad, respectively. The p-channel and n-channel biasing transistors are thus in series between $V_{cc}$ and the drain of the pullup p-channel transistor. In operation, when the input signal transitions to a low state, the biasing transistors cause the pullup transistor to conduct. The respective "ON" resistances of the biasing p-channel, and biasing n-channel transistors are selected so as to produce a predetermined bias level at the pullup gate terminal such that $V_{OH}$ is reduced by a predetermined amount, relative to $V_{cc}$. In one embodiment, the predetermined bias level is selected such that $V_{OH}$ is approximately 4 volts when $V_{cc}$ is approximately 5 volts. Thus, an embodiment in accordance with this invention may be used in logic devices requiring a reduced output voltage $V_{OH}$ when operating at the 5 volt operating standard. Only minor changes to the connections of the biasing p-channel, and biasing n-channel transistors are required to permit the pullup p-channel transistor to pullup all the way to $V_{cc}$, such as is desirable when operating at, for example, the 3 volt standard.

In another aspect of this invention, a logic device including the inventive output buffer is provided. Such a logic device may comprise, in various embodiments, a binary counter, a transceiver, a multiplexer, a register, a latch, and/or a buffer of various bit-widths.

In yet another aspect of this invention, a method of operating the output buffer described above is provided. The method includes two basic steps. The first step includes providing a p-channel pullup transistor connected between a positive power supply bus ($V_{cc}$), and the pad. The second step involves biasing the p-channel pullup transistor, as a function of a voltage level of the pad, so as to produce a logic high output signal on the pad that has a magnitude that is reduced relative to $V_{cc}$.

Other objects, features and advantages of the present invention will become apparent to one skilled in the art from the following detailed description and the accompanying drawings illustrating features of this invention by way of example, but not by way of limitation.

DETAILED DESCRIPTION OF THE PREFERRED EMBODIMENTS

Figure 1:
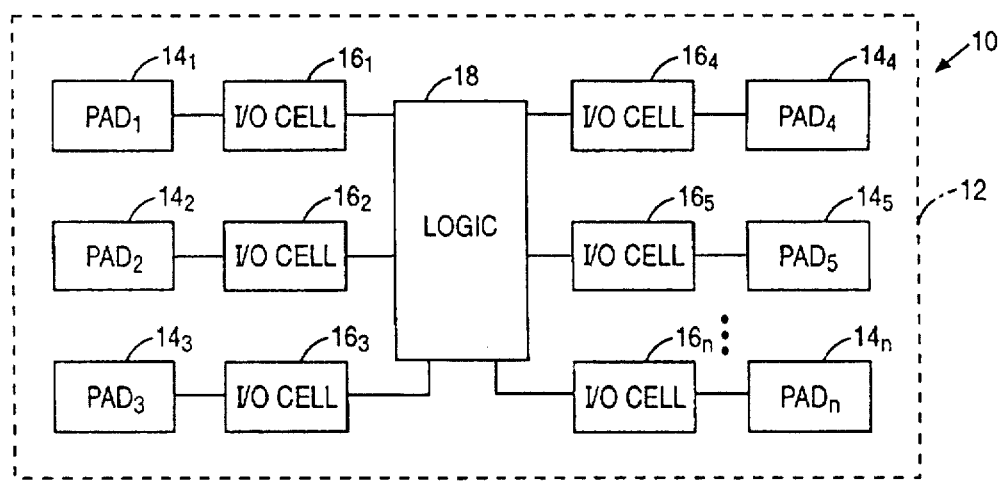
FIG. 1 is a simplified block diagram illustrating a logic cell embodiment of the present invention, including the inventive output buffer.

Referring now to the drawings wherein like reference numerals are used to identify identical components in the various views, FIG. 1 shows a semiconductor device 10 fabricated in accordance with the present invention. Device 10 includes a semiconductor die or body portion 12, containing various structures fabricated therein, such as a plurality of pads $14_1, 14_2, \ldots, 14_n$, connected to a corresponding plurality of input/output (I/O) cells $16_1, 16_2, \ldots, 16_n$, and a logic block 18.

As is well-known, each pad $14_i$ is provided for connecting to a corresponding conductor (e.g., pin) disposed in a semiconductor package, and for interfacing with signals external semiconductor body 12 (e.g., a bus or backplane connected to other devices).

Each I/O cell $16_i$ is provided for driving the potential on a corresponding pad $14_i$ to a logic high level, a logic low level, or a high impedance state (i.e., tri-state), in a case of an output function. In a case of an input function, such I/O cells provide input buffering, and level translation (as required). Thus, it should be appreciated that the connections between respective pads, and I/O cell $16_i$ may be bi-directional. The present invention relates to the above-identified output function of I/O cell $16_i$.

Logic block 18 is responsive to one or more input signals from selected ones of the I/O cells $16_i$ for performing a logic function using these input signals. Block 18 also functions to provide an output signal (e.g., the result of the logic function) to a selected one(s) of the I/O cells $16_i$ for output on a corresponding pad $14_i$ associated therewith. Logic block 18 may take many forms, as required, in order to accomplish the overall function of device 10. A device 10 according to the present invention includes at least one I/O cell 16, and in particular, an output buffer portion in accordance with the present invention, the details of which are to be set forth hereinafter. For example, and not by way of limitation, device 10 may comprise any one of the following commercially available logic devices, as modified according to the present invention (the model number of a commercially available part from the assignee of the present invention appears parenthetically): 8-bit registered transceiver (CY29FCT52T), multi-level pipeline register (CY29FCT520T), diagnostic scan register (CY29FCT818T), one-of-eight decoder (CY54/74FCT138T), quad two-input multiplexer (CY54/74FCT157T), 4-bit binary counter (CY54/74FCT163T), 8-bit buffer/line driver (CY54/74FCT240T), 10-bit buffer (CY54/74FCT827T), and 8-bit latch (CY54/74FCT373T), an 8-bit bus interface register (CY54/74FCT821T), an 8-bit register (CY54/74FCT374T), and/or a dual 8-bit parity generator/checker (CY54/74FCT480T). It should be understood that the foregoing is not intended to limit application of the present invention; indeed, there are many other logic devices suitable for use in connection with the present invention, including other logic products in the above-referenced FCT logic product family line available from the assignee of the present invention, as well as other logic devices, logic families, programmable logic, memory devices, etc.

Before proceeding to a detailed description of the preferred embodiments referenced to the drawings, the concept and control of the present invention will be set forth in detail. An embodiment of the present invention employs a p-channel transistor as the pullup device for both 5 volt, and 3 volt implementations of a device 10 in which the invention is embodied. Thus, no complicated and expensive process masks changes are required for converting between p-channel, and n-channel transistors to implement the pullup function. For a 3 volt implementation, the p-channel pullup transistor is permitted to pull the output on the pad all the way up to the positive power supply bus $V_{cc}$ (i.e., "full" rail swing), as may be conventionally accomplished in a number of ways. However, significantly, for a 5 volt implementation, an additional bias circuit is provided that biases the gate terminal of the pullup p-channel transistor so that a reduced magnitude logic high output (i.e., "reduced" swing) may be obtained. The concept involved here is to connect the p-channel pullup transistor as a diode between $V_{cc}$ and the pad, thus using the diode "drop" as the swing reducing mechanism. That is, the p-channel pullup transistor itself is connected between the positive power supply bus $V_{cc}$, and the pad, as a diode. This connection is accomplished by selectively connecting its gate terminal to its drain terminal (i.e., the output pad). Thus, when the output pad $14_i$ is to be driven high, the gate of the p-channel pullup transistor is connected to its drain. When the gate and drain voltages approach the positive power supply bus $V_{cc}$, there is no longer a threshold voltage $V_{tp}$ difference between the gate and source terminals of the p-channel pullup device. Under these conditions, the p-channel pullup device shuts off.

The descriptions which follow together with the circuit diagrams are simplified to aid understanding. In particular, the logic driving the output pullup and pulldown transistor, in practical implementations of certain embodiments must incorporate circuits to allow both transistors to be turned off when the output is required to be in the high impedance state. These circuits are not shown in the drawings for simplicity.

Figure 2:
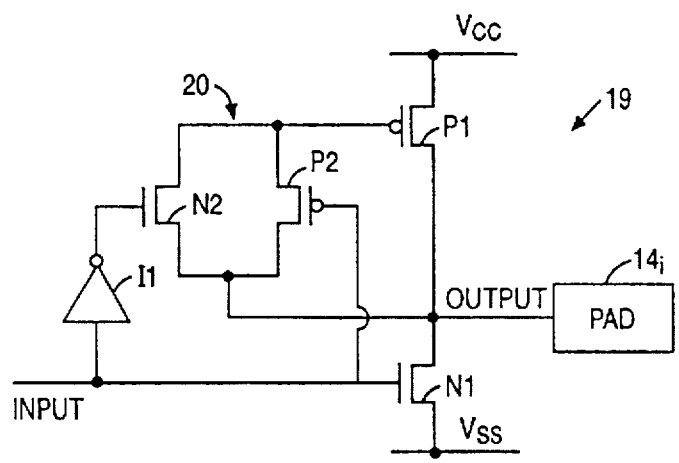
FIG. 2 is a simplified schematic and block diagram view showing, in greater detail, the output buffer depicted in FIG. 1, in a first embodiment.

FIG. 2 illustrates a first embodiment in accordance with the present invention. In particular, an output buffer 19 is connected to pad $14_i$ (where i equals any integer up to the number of pads in the device 10), and which includes a p-channel pullup field effect transistor (FET) P1, means, such as an n-channel FET N1, for pulling the voltage level on the pad to a logic low state (which may be a ground potential $V_{ss}$), and means, such as a CMOS transfer gate 20, for connecting the gate terminal of p-channel pullup P1 to an output node (indicated at OUT). Transfer gate 20 includes an inverter I1 for producing an inverted version of the input signal INPUT, a transfer gate n-channel transistor N2, and a transfer gate p-channel transistor P2.

In operation, when the input signal INPUT goes to a logic low state, transistors N2 and P2 cooperate to connect the gate of pullup p-channel transistor P1 with the output node OUT, which is also the drain terminal of transistor P1. Thus, the gate, and drain terminals of pullup transistor P1 are connected together to form, in-effect, a diode between the positive power supply bus $V_{cc}$, and the output node OUT, which is connected to output pad $14_i$. Transistor P1 will shut off when its gate-to-source voltage $V_{gs}$ is less than $VT_p$ (which is approximately 0.75 volts for typical process parameters). It should be appreciated, then, that when $V_{cc}$ is approximately 5 volts, that a logic high voltage level on the output pad $14_i$ is approximately 4.25 volts. This output level may be satisfactory in certain environments, depending upon the desired specifications for $V_{OH}$ of a device embodying this aspect of the present invention. The actual level of $V_{OH}$ reached will also depend on the current flowing through transistor P1 to the output load.

Figure 3:
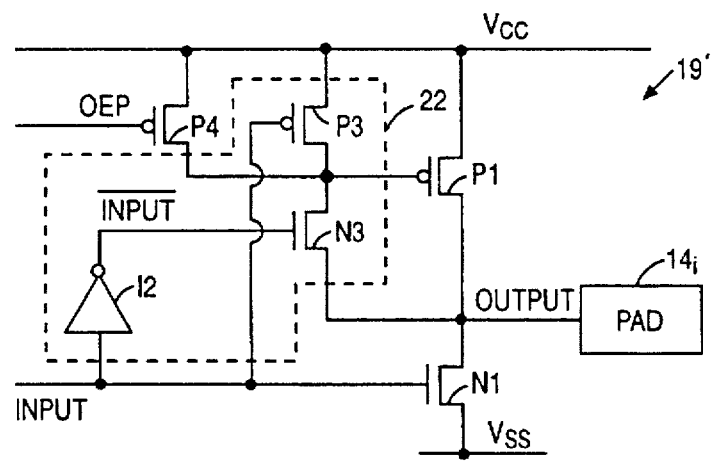
FIG. 3 is a simplified schematic and block diagram view showing, in greater detail, the output buffer depicted in block form in FIG. 1, in a second preferred embodiment.

Referring now to FIG. 3, a second, preferred embodiment is illustrated that provides a logic high output level on the output pad $14_i$ that is even further reduced relative to $V_{cc}$, as compared with the embodiment illustrated in FIG. 2. The output buffer 19 comprises pullup p-channel transistor P1, pulldown means, such as an n-channel transistor N1, for pulling the pad low to a voltage level defined by a negative power supply bus $V_{ss}$, means, such as a biasing circuit 22, for biasing the gate terminal of pullup p-channel transistor P1, and output enable means, such as a p-channel transistor P4, for biasing the gate terminal of transistor P1 to place P1 in a substantially non-conductive state.

Transistor P1 performs the function of pulling pad $14_i$ to a logic high state having a magnitude reduced relative to the device operating voltage $V_{cc}$. Transistor P1 includes a source terminal connected to $V_{cc}$, and a drain terminal connected to the output node (indicated at OUT), which is in turn connected to output pad $14_i$. The transistor P1 may be a multi-finger device for providing an increased, aggregate channel width for meeting output current ($I_{OH}$) requirements. Alternatively, there may be multiple transistors (P1) in parallel which share one biasing circuit or there may also be multiple biasing circuits. In the preferred embodiment, the positive power supply bus produces a predetermined voltage level of approximately 5 volts. The conduction of transistor P1 is controlled by a bias voltage on a gate terminal in a manner to be described in further detail hereinafter.

Transistor N1 is connected between the output node/pad $14_i$, and a negative power supply bus $V_{ss}$ which may be at a ground potential. The pulldown transistor N1 is responsive to the input signal INPUT for performing the function of pulling the pad 14 to a logic low state. In this low state, the pad $14_i$ may be at a voltage substantially equivalent to the negative power supply bus $V_{ss}$. Pulldown device N1 is conventional, and well-known in the art.

Biasing circuit 22 includes inverter I2, n-channel transistor N3, and p-channel transistor P3. The biasing circuit 22 is responsive to the input signal INPUT, and further, responsive to a feedback voltage signal from the output pad $14_i$, for biasing the gate terminal of P1 so as to produce a reduced $V_{OH}$, relative to $V_{cc}$.

Inverter I2 is responsive to the input signal INPUT, for generating, on an output terminal thereof, an inverted version of the input signal, namely, $\overline{INPUT}$. This signal is coupled to the gate terminal of transistor N3 to turn N3 "ON" when the INPUT goes low. Inverter I2 is conventional, and well-known in the art.

N-channel transistor N3 includes drain and source terminals connected to the gate of P1, and to the output pad, respectively. To reduce the output voltage at the drain terminal of transistor P1 to a level lower than that exhibited in the embodiment of FIG. 2 (i.e., $V_{OH}$), a bias voltage applied to the gate of P1 should be slightly higher than the voltage on its drain. By varying the conductivity of transistor N3, a continuously variable degree of decoupling of the gate of P1 from the drain of P1 may be obtained. Once decoupled, the gate can be pulled higher using transistor P3.

Biasing p-channel transistor P3 includes a source terminal connected to $V_{cc}$, and a drain terminal connected to the gate of transistor P1. When P3 is activated, it functions to pull the gate terminal of transistor P1 to a voltage potential higher than the potential existing at the drain of P1. This is possible due to the decoupling effect provided by transistor N3.

Output enable p-channel transistor P4 is responsive to an output enable signal OEP for biasing the gate terminal of pullup transistor P1 so as to place transistor P1 in a substantially non-conductive state. That is, in the illustrated embodiment, transistor P4 is used to pull the gate of transistor P1 substantially equal to $V_{cc}$ when the pullup transistor is required to be completely off. For example, this function is desirable when the output buffer is to be tri-stated, or when the output pad is to be pulled to a logic zero by activating pulldown device N1.

The equivalent signal to OEP for tri-stating transistor N1 and the associated logic required is not shown in the Figures since they are well-known in the art and are conventional. In an actual implementation, such logic for generating the tri-stating signal may be required, depending on the requirements of the particular embodiment.

Figure 4:
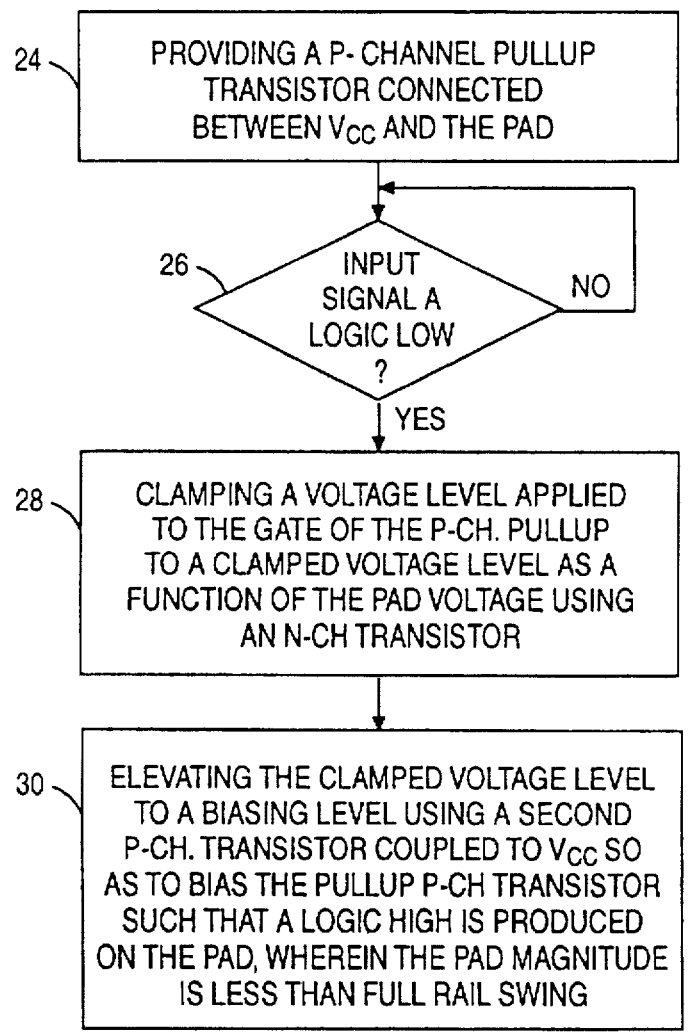
FIG. 4 is a flow-chart diagram illustrating the basic steps involved in a method of operating an output buffer according to the present invention.

Referring now to FIG. 4, the operation of the embodiment illustrated in FIG. 3 will now be set forth. Assume initially that the output enable signal OEP is deactivated (i.e., a logic low, which turns "ON" P4). Further assume that the input signal INPUT is a logic high. In this situation, the p-channel pullup transistor P1 is completely OFF, as are transistors N3, and P3. Pulldown device N1 is ON, wherein the output pad is driven to a logic low state. So long as these conditions persist, P1 is OFF, and the output pad is low (steps 26, and 24).

Next assume that the output enable signal OEP is now activated (i.e., a logic high to thereby shut P4 "OFF") while the input signal INPUT transitions to a logic low state. Initially, the voltage level on the output pad is substantially equal to or near $V_{ss}$. Thus, the drain of transistor P1 is near $V_{ss}$, and transistor N3 is switched on due to the inverter I2 driving a logic high to the gate of N3. In particular, transistor N3 has a very high gate-to-source voltage $V_{gs}$, and therefore it provides a relatively low resistance channel (i.e., it is "hard" ON).

The gate, and drain of transistor P1 then begin to rise toward $V_{cc}$. As the voltage level on the output pad $14_i$/drain of P1/drain of N3 increases in magnitude, the gate-to-source voltage $V_{gs}$ of transistor N3 decreases wherein the transistor N3 begins to turn "OFF" (i.e., its "ON" resistance increases). As the "ON" resistance increases, the gate terminal of pullup transistor P1 gradually becomes decoupled from the drain terminal of transistor P1. This action of transistor N3 is shown in step 28.

Transistor P3 is also ON, since it is driven by the now-logic-low input signal INPUT. This p-channel transistor P3 thus elevates the voltage being applied to the gate of P1 towards $V_{cc}$. This is shown in step 30. The bias voltage thus applied to the gate of pullup transistor P1 is effectively controlled by the voltage divider effect of the respective "ON" resistances of transistors P3, and N3. These transistors effectively divide the voltage between $V_{cc}$, and the magnitude of the voltage on the drain of transistor P1 (i.e., the voltage on the output pad $14_i$). This predetermined bias voltage applied to the gate of transistor P1 is selected to shut off pullup transistor P1 earlier than the embodiment illustrated in FIG. 2 (which, in-effect, simply connects pullup transistor P1 in a diode arrangement, having its gate terminal tied to its drain terminal). Earlier shut off of P1 results in a lower $V_{OH}$.

As an added benefit, the current flowing through transistors N3, and P3 contribute to the increase in the voltage of the output pad, thus enhancing (i.e., reducing) the rise time needed to go from a logic low to a logic high. P-channel transistor P3 may be sized so that under no-load conditions, the pullup transistor P1 turns off completely at a predetermined output voltage $V_{OH}$; accordingly, such output $V_{OH}$ may not increase beyond such desired level. In the preferred embodiment, $V_{OH}$ may be approximately 4 volts when $V_{cc}$ is substantially equal to 5 volts. Design of the transistors P3 and N3, once the needed "ON" resistances have been selected, is a routine matter within the capabilities of one of ordinary skill in the art.

Yet another advantage of the present invention is the simplicity and flexibility of design. In particular, the circuit of FIG. 3 need be subjected only to minor changes for full-swing operation, such as may be desirable for use in 3 volt environments (e.g., in the illustrated embodiment disconnecting the source of P3 from $V_{cc}$, and connecting N2 to $V_{ss}$—rather than to the output node). These changes can be implemented with a relatively uncomplicated (i.e., inexpensive) process mask change. The cost savings realized from the foregoing design provides for a more competitive product than conventional devices.

While the present invention has been particularly shown and described with reference to the preferred embodiments thereof, it well understood by those skilled in the art that various changes and modifications can be made in the invention without departing from the spirit and scope thereof, the invention being limited only by the appended claims.

We claim:

1. An output buffer responsive to an input signal for generating an output signal on a pad connected thereto, comprising:

a pullup p-channel transistor having a source terminal connected to a positive power supply bus producing a predetermined voltage level, and a drain terminal connected to said pad, said p-channel transistor further including a gate terminal; and means for biasing said gate terminal of said pullup p-channel transistor using a voltage level signal of the pad so as to produce said output signal on said pad in a logic high state having a magnitude that is reduced relative to said predetermined voltage level, said biasing means being configured to place said pullup p-channel transistor in conductive and nonconductive states in response to said input signal in first and second logic states, respectively.

2. The output buffer of claim 1 wherein said biasing means includes:

a transfer gate responsive to said input signal for coupling said voltage level signal of said pad to said gate terminal of said pullup p-channel transistor.

3. The output buffer of claim 2 wherein said transfer gate includes:

a transfer gate p-channel transistor having drain and source terminals connected between said gate terminal of said pullup p-channel transistor and said pad, said transfer gate p-channel transistor further having a gate terminal;

a transfer gate n-channel transistor having source and drain terminals connected between said gate terminal of said pullup p-channel transistor and said pad, said transfer gate n-channel transistor having a gate terminal thereof;

wherein said transfer gate n-channel transistor, and said transfer gate p-channel transistor are responsive to said input signal, and an inverted version of said input signal applied to respective gate terminals thereof for connecting said pad to said gate terminal of said pullup p-channel.

4. An output buffer responsive to an input signal for generating an output signal on a pad connected thereto, comprising:

a pullup p-channel transistor having a source terminal connected to a positive power supply bus producing a predetermined voltage level, and a drain terminal connected to said pad, said p-channel transistor further including a gate terminal; and means for biasing said gate terminal of said pullup p-channel transistor using a voltage level signal of the pad so as to produce said output signal on said pad in a logic high state having a magnitude that is reduced relative to said predetermined voltage level, said biasing means including (i) a biasing p-channel transistor having source and drain terminals connected to said positive power supply bus and said gate terminal of said pullup p-channel transistor, respectively, said biasing p-channel transistor further including a gate terminal responsive to said input signal, and (ii) a biasing n-channel transistor having drain and source terminals connected to said gate terminal of said pullup p-channel transistor and said pad, respectively, said n-channel transistor further including a gate terminal responsive to an inverted input signal;

wherein when said input signal transitions to a logic low state, said biasing transistors bias said gate terminal of said pullup p-channel transistor to a predetermined bias level so as to produce said output signal on said pad in said logic high state having said reduced magnitude.

5. The output buffer of claim 4 further including output enable means responsive to an output enable signal for biasing said gate terminal of said pullup p-channel transistor for placing said pullup transistor in a non-conductive state.

6. The output buffer of claim 5 wherein said output enable means comprises an output enable p-channel transistor having source and drain terminals connected to said positive power supply bus, and said gate terminal of said pullup transistor, respectively, said output enable p-channel transistor further including a gate terminal responsive to said output enable signal.

7. The output buffer of claim 4 further including a pulldown circuit coupled between said pad and a negative power supply bus, said pulldown circuit being responsive to said input signal for pulling said pad low to a voltage level defined by said negative power supply bus.

8. The output buffer of claim 7 wherein said pulldown circuit includes a pulldown n-channel device having drain and source terminals coupled to said pad, and to said negative power supply bus, respectively, said pulldown n-channel device further including a gate terminal responsive to said input signal.

9. The output buffer of claim 4 further including an inverter responsive to said input signal and having an output coupled to said gate terminal of said biasing n-channel transistor.

10. The output buffer of claim 4 further including:
a pulldown circuit coupled between said pad and a negative power supply bus, said pulldown circuit being responsive to said input signal for pulling said pad low to a voltage level defined by said negative power supply bus;
output enable means responsive to an output enable signal for biasing said gate terminal of said pullup p-channel transistor such that said pullup transistor is in a substantially non-conductive state; and,
an inverter responsive to said input signal and having an output coupled to said gate terminal of said biasing n-channel transistor.

11. The output buffer of claim 10 wherein said pulldown circuit includes a pulldown n-channel device having drain and source terminals coupled to said pad, and to said negative power supply bus, respectively, said pulldown n-channel device further including a gate terminal responsive to said input signal, and wherein said output enable means includes an output enable p-channel transistor having source and drain terminals connected to said positive power supply bus, and said gate terminal of said pullup transistor, respectively, said output enable p-channel transistor further including a gate terminal responsive to said output enable signal.

12. A logic device having an improved output buffer connected to a pad of said device, comprising:
a semiconductor body portion having a plurality of output buffers for generating signals for use external to said semiconductor body wherein at least one of said plurality of output buffers includes,
a pullup p-channel transistor having source and drain terminals connected to a positive power supply bus producing a predetermined voltage level, and said pad, respectively, said p-channel transistor further including a gate terminal;
means for biasing said gate terminal of said pullup p-channel transistor so as to produce an output signal on said one pad associated with said one output buffer in a logic high state having a magnitude reduced relative to said predetermined voltage level, said biasing means being configured to place said pullup p-channel transistor in conductive and nonconductive states in response to said input signal in first and second logic states, respectively.

13. The device of claim 12 wherein said biasing means includes a transfer gate, said transfer gate comprising:
a transfer gate p-channel transistor having drain and source terminals connected between said gate terminal of said pullup p-channel transistor and said pad, said transfer gate p-channel transistor further having a gate terminal;
a transfer gate n-channel transistor having source and drain terminals connected between said gate terminal of said pullup p-channel transistor and said pad, said transfer gate n-channel transistor having a gate terminal thereof;
wherein said transfer gate n-channel transistor, and said transfer gate p-channel transistor are responsive to said input signal, and an inverted version of said input signal applied to respective gate terminals thereof for connecting said pad to said gate terminal of said pullup p-channel.

14. A logic device having an improved output buffer connected to a pad of said device, comprising:
a semiconductor body portion having a plurality of output buffers for generating signals for use external to said semiconductor body wherein at least one of said plurality of output buffers includes,
a pullup p-channel transistor having source and drain terminals connected to a positive power supply bus producing a predetermined voltage level, and said pad, respectively, said p-channel transistor further including a gate terminal;
means for biasing said gate terminal of said pullup p-channel transistor so as to produce an output signal on said one pad associated with said one output buffer in a logic high state having a magnitude reduced relative to said predetermined voltage level, said biasing means including (i) a biasing p-channel transistor having source and drain terminals connected to said positive power supply bus and said gate terminal of said pullup p-channel transistor, respectively, said biasing p-channel transistor further including a gate terminal responsive to an input signal, and (ii) a biasing n-channel transistor having drain and source terminals connected to said gate terminal of said pullup p-channel transistor and said pad, respectively, said n-channel transistor further including a gate terminal responsive to an inverted input signal;
wherein when said input signal transitions to a logic low state, said biasing transistors bias said gate terminal of said pullup p-channel transistor to a predetermined bias level so as to produce said output signal on said one pad in said logic high state having said reduced magnitude.

15. The device of claim 14 wherein said one output buffer further includes output enable means responsive to an output enable signal for biasing said gate terminal of said pullup p-channel transistor for placing said pullup transistor in a non-conductive state.

16. The device of claim 15 wherein said output enable means of said one output buffer comprises an output enable p-channel transistor having source and drain terminals connected to said positive power supply bus, and said gate terminal of said pullup transistor, respectively, said output enable p-channel transistor further including a gate terminal responsive to said output enable signal.

17. The device of claim 14 wherein said one output buffer further includes a pulldown circuit coupled between said pad and a negative power supply bus, said pulldown circuit being responsive to said input signal for pulling said pad low to a voltage level defined by said negative power supply bus.

18. The device of claim 14 wherein said one output buffer further includes:
- a pulldown circuit coupled between said pad and a negative power supply bus, said pulldown circuit being responsive to said input signal for pulling said pad low to a voltage level defined by said negative power supply bus;
- output enable means responsive to an output enable signal for biasing said gate terminal of said pullup p-channel transistor such that said pullup transistor is in a substantially non-conductive state; and,
- an inverter responsive to said input signal and having an output coupled to said gate terminal of said biasing n-channel transistor.

19. The device of claim 18 wherein said pulldown circuit of said one output buffer includes a pulldown n-channel device having drain and source terminals coupled to said pad, and to said negative power supply bus, respectively, said pulldown n-channel device further including a gate terminal responsive to said input signal, and wherein said output enable means includes an output enable p-channel transistor having source and drain terminals connected to said positive power supply bus, and said gate terminal of said pullup transistor, respectively, said output enable p-channel transistor further including a gate terminal responsive to said output enable signal.

20. In a semiconductor device having an output buffer responsive to an input signal for generating an output signal on a pad connected to the output buffer, a method of operating the output buffer, comprising the steps of:

(A) providing a p-channel pullup transistor connected between a positive power supply bus producing a predetermined voltage level and the pad;

(B) biasing the p-channel pullup transistor to a conductive state as a function of a voltage level of the pad and said input signal in a first logic state so as to produce the output signal on the pad in a logic high state having a magnitude that is reduced relative to the predetermined voltage level (C) biasing said p-channel pullup transistor to a nonconductive states in response to said input signal in a second logic state different from said first logic state.

21. The method of claim 20 further including the step of:

disabling the p-channel pullup transistor from producing the output signal in the high state when an output enable signal is deactivated.

22. In a semiconductor device having an output buffer responsive to an input signal for generating an output signal on a pad connected to the output buffer, a method of operating the output buffer, comprising the steps of:

(A) providing a p-channel pullup transistor connected between a positive power supply bus producing a predetermined voltage level and the pad;

(B) biasing the p-channel pullup transistor as a function of a voltage level of the pad so as to produce the output signal on the pad in a logic high state having a magnitude that is reduced relative to the predetermined voltage level, said biasing step including the substeps of (i) clamping a voltage level applied to a gate terminal of the p-channel pullup transistor to a clamped voltage level as a function of the pad voltage level using a biasing n-channel transistor coupled between the pad and the gate terminal of the p-channel pullup transistor, and (ii) elevating the clamped voltage level to a biasing voltage level using a biasing p-channel transistor coupled between said positive power supply bus and the gate terminal of the pullup p-channel transistor so as to obtain the reduced magnitude output signal on the pad;

(C) disabling the p-channel pullup transistor from producing the output signal in the high state when an output enable signal is deactivated.

23. The method of claim 22 wherein said clamping and elevating substeps are performed as a function of the input signal.

* * * * *